United States Patent
Pinkovich et al.

(10) Patent No.: US 9,449,702 B1
(45) Date of Patent: Sep. 20, 2016

(54) POWER MANAGEMENT

(71) Applicant: DENSBITS TECHNOLOGIES LTD., Haifa (IL)

(72) Inventors: Dani Pinkovich, Nesher (IL); Hanan Weingarten, Herzelia (IL)

(73) Assignee: AVAGO TECHNOLOGIES GENERAL IP (SINGAPORE) PTE. LTD., Yishun (SG)

( * ) Notice: Subject to any disclaimer, the term of this patent is extended or adjusted under 35 U.S.C. 154(b) by 0 days.

(21) Appl. No.: 14/326,142

(22) Filed: Jul. 8, 2014

(51) Int. Cl.
*G11C 5/14* (2006.01)
*G11C 16/30* (2006.01)
*G01R 21/00* (2006.01)
*G01R 31/26* (2014.01)

(52) U.S. Cl.
CPC ............... *G11C 16/30* (2013.01); *G01R 21/00* (2013.01); *G01R 31/2601* (2013.01)

(58) Field of Classification Search
CPC .................. G11C 16/0483; G11C 2029/5006; G11C 29/56; G11C 5/14
USPC ......... 365/185.11, 185.17, 185.33, 226, 227, 365/229, 185.18; 324/76.11
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,592,641 A | 1/1997 | Doyle et al. | |
| 5,623,620 A | 4/1997 | Alexis et al. | |
| 5,640,529 A | 6/1997 | Hasbun | |
| 5,657,332 A | 8/1997 | Auclair et al. | |
| 5,663,901 A | 9/1997 | Harari et al. | |
| 5,724,538 A | 3/1998 | Morris | |
| 5,729,490 A | 3/1998 | Calligaro et al. | |
| 5,740,395 A | 4/1998 | Wells | |
| 5,745,418 A | 4/1998 | Hu et al. | |
| 5,778,430 A | 7/1998 | Ish | |
| 5,793,774 A | 8/1998 | Usui et al. | |
| 5,920,578 A | 7/1999 | Zook | |
| 5,926,409 A | 7/1999 | Engh et al. | |

(Continued)

FOREIGN PATENT DOCUMENTS

WO    WO2009053963 A2    4/2009

OTHER PUBLICATIONS

Search Report of PCT Patent Application WO 2009/118720 A3, Mar. 4, 2010.

(Continued)

*Primary Examiner* — Fernando Hidalgo
(74) *Attorney, Agent, or Firm* — Reches Patents

(57) ABSTRACT

According to an embodiment of the invention there may be provided a method for measuring, by a power measurement circuit of a memory controller, a power consumption of a flash memory unit coupled to the memory controller to provide power measurements; wherein the memory controller further may include a read circuit, a write circuit, an erase circuit and a processor.

25 Claims, 6 Drawing Sheets

(56) References Cited

U.S. PATENT DOCUMENTS

| | | |
|---|---|---|
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Kwon |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |

(56) References Cited

U.S. PATENT DOCUMENTS

| | | |
|---|---|---|
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |
| 2013/0124901 A1* | 5/2013 | Mayer .......................... 713/340 |
| 2013/0301372 A1* | 11/2013 | Park et al. .................... 365/227 |
| 2014/0003180 A1* | 1/2014 | Matsuda ....................... 365/226 |
| 2015/0098272 A1* | 4/2015 | Kasorla et al. .......... 365/185.11 |

OTHER PUBLICATIONS

Search Report of PCT Patent Application WO 2009/095902 A3, Mar. 4, 2010.

Search Report of PCT Patent Application WO 2009/078006 A3, Mar. 4, 2010.

(56) References Cited

OTHER PUBLICATIONS

Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, page(s): II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technqiue", Ieee Transactions on Electron Devices, vol. 47, No. 4, Apr. 2000.
Giovanni Campardo, Rino Micheloni, David Novosel, "VLSI—Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Acica, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

300

500

POWER MANAGEMENT

BACKGROUND OF THE INVENTION

Flash memory operations such as erasing, programming (writing), and reading involve electrical operations and thus consume power. Flash memory units are widely used in devices, which have strict power consumption constraints, such as laptops and mobile devices. For this reason, it is important for a flash memory controller (that controls the flash memory unit) to be power efficient.

SUMMARY

According to an embodiment of the invention there may be provided a method for measuring, by a power measurement circuit of a memory controller, a power consumption of a flash memory unit coupled to the memory controller to provide power measurements, wherein the memory controller further may include a read circuit, a write circuit, an erase circuit, and a processor.

The power measurement circuit may include a voltmeter, a resistor, a switching circuit, and a power output, wherein method may include providing, via the power output, power to the memory controller, measuring by the voltmeter a voltage developed on the resistor and selectively coupling, by the switching circuit, the resistor to the power output.

According to an embodiment of the invention there may be provided a method for controlling a flash memory unit, the method may include receiving or generating, by a memory controller, power measurements indicative of power consumed by a flash memory unit coupled to the memory controller.

The method may include controlling an operation of at least one of the read circuit, write circuit and the erase circuit in response to the power measurements.

The method may include determining at least one operational parameter in response to the power measurements; wherein at least one of (a) a write operation executed by the write circuit, (b) an erase operation executed by the erase circuit, and (c) a read operation executed by the read circuit may be responsive to the at least one operational parameter.

The method may include determining at least one operational parameter in response to the power measurements so impose a limitation on the power consumption of the flash memory unit.

The method may include determining at least one operational parameter in response to the power measurements so comply with a power consummation constraint related to the power consumption of the flash memory unit and at least one out of a reliability constraint (for example bit error rate BER or any other measure) related to a reliability of content stored in the flash memory unit; a timing constraint (for example programming speed, an erase speed) related to a duration of at least one operation out of a read operation, a programming operation and an erase operation, and a wear constraint (for example weal level) related to a wear level of cells of the flash memory unit.

The method may include evaluating a functionality of the flash memory unit in response to the power measurements.

The method may include applying multiple sets of operational parameters during an obtaining of the power measurement results; may include determining a validity of each set of operational parameters in response to the power measurements.

The method may include disqualifying a set of operational parameters when power measurements obtained when the set of operations were applied by the memory controller indicate of a power consumption that deviates from an allowable power consumption of the flash memory unit.

The method may include disqualifying a set of operational parameters when power measurements obtained when the set of operations were applied by the memory controller indicate that an instruction to perform an operation out of a read operation, write operation and erase operation was not performed.

The method may include evaluating a temperature of the flash memory unit in response to the power measurements and in response to temperature-power mapping information that maps power consumptions and temperature.

The method may include evaluating a wear level of at least one groups of cells of the flash memory unit in response to the power measurements and in response to wear-power mapping information that maps power consumptions and wear levels.

The method may include generating the wear-power mapping information.

The method may include performing memory management operations in response to the power measurements.

The method may include electing groups of flash memory cells to be written by the write circuit in response to the power measurements.

The method may include controlling an operation of at least one of the read circuit, write circuit, and the erase circuit in response to the power measurements and in response to a state of a power supply unit that may be arranged to provide power to at least one out of the memory controller and the flash memory unit.

The method may include defining different tradeoffs between power consumption parameters and other operational parameters at different states of the power supply unit.

The other operational parameters may be selected of a group consisting of (i) a reliability of content stored in the flash memory unit, (ii) a duration of at least one operation out of a read operation, a programming operation and an erase operation, and (iii) a wear resulting from the at least one operation.

The method may include determining, in response to the state of the power supply, whether to write data into a flash memory page of the flash memory unit without buffering the data in a non-volatile buffer.

The method may include measuring power consumptions of multiple flash memory units that may be coupled to the memory controller to provide the power measurements, wherein the multiple flash memory units may include the flash memory unit.

The method may include differentiating between power measurements related to different flash memory units by comparing the power measurements to profiles of power consumptions of the different flash memory units.

The method may include performing input/output operations with different flash memory units in a non-overlapping manner.

According to an embodiment of the invention there may be provided a memory controller, the memory controller may include a read circuit, a write circuit, an erase circuit, a power measurement circuit and a processor; wherein the power measurement circuit may be arranged to measure a power consumption of a flash memory unit coupled to the memory controller to provide power measurements.

The power measurement circuit may include a voltmeter, a resistor, a switching circuit, and a power output, wherein power output may be arranged to provide power to the memory controller, wherein the voltmeter may be arranged to measure a voltage developed on the resistor, wherein the switching circuit may be arranged to selectively couple the resistor to the power output.

The processor may be arranged to control an operation of at least one of the read circuit, write circuit and the erase circuit in response to the power measurements.

The processor may be arranged to determine at least one operational parameter in response to the power measurements; wherein at least one of (a) a write operation executed by the write circuit, (b) an erase operation executed by the erase circuit, and (c) a read operation executed by the read circuit may be responsive to the at least one operational parameter.

The processor may be arranged to determine at least one operational parameter in response to the power measurements so impose a limitation on the power consumption of the flash memory unit.

The processor may be arranged to determine at least one operational parameter in response to the power measurements so comply with a power consummation constraint related to the power consumption of the flash memory unit and at least one out of a reliability constraint related to a reliability of content stored in the flash memory unit; a timing constraint related to a duration of at least one operation out of a read operation, a programming operation and an erase operation, and a wear constraint related to a wear level of cells of the flash memory unit.

The processor may be arranged to evaluate a functionality of the flash memory unit in response to the power measurements.

The memory controller may be arranged to apply multiple sets of operational parameters during an obtaining of the power measurement results; wherein the processor may be arranged to determine a validity of each set of operational parameters in response to the power measurements.

The processor may be arranged to disqualify a set of operational parameters when power measurements obtained when the set of operations were applied by the memory controller indicate of a power consumption that deviates from an allowable power consumption of the flash memory unit.

The processor may be arranged to disqualify a set of operational parameters when power measurements obtained when the set of operations were applied by the memory controller indicate that an instruction to perform an operation out of a read operation, write operation and erase operation was not performed.

The processor may be arranged to evaluate a temperature of the flash memory unit in response to the power measurements and in response to temperature-power mapping information that maps power consumptions and temperature.

The processor may be arranged to evaluate a wear level of at least one groups of cells of the flash memory unit in response to the power measurements and in response to wear-power mapping information that maps power consumptions and wear levels.

The memory controller may be arranged to generate the wear-power mapping information.

The processor may be arranged to perform memory management operations in response to the power measurements.

The memory controller may be arranged to elect groups of flash memory cells to be written by the write circuit in response to the power measurements.

The processor may be arranged to control an operation of at least one of the read circuit, write circuit and the erase circuit in response to the power measurements and in response to a state of a power supply unit that may be arranged to provide power to at least one out of the memory controller and the flash memory unit.

The processor may be arranged to define different tradeoffs between power consumption parameters and other operational parameters at different states of the power supply unit.

The other operational parameters may be selected of a group consisting of (i) a reliability of content stored in the flash memory unit, (ii) a duration of at least one operation out of a read operation, a programming operation and an erase operation, and (iii) a wear resulting from the at least one operation.

The processor may be arranged to determine, in response to the state of the power supply, whether to write data into a flash memory page of the flash memory unit without buffering the data in a non-volatile buffer.

The power measurement circuit may be arranged to measure power consumptions of multiple flash memory units that may be coupled to the memory controller to provide the power measurements, wherein the multiple flash memory units may include the flash memory unit.

The processor may be arranged to differentiate power measurements related to different flash memory units by comparing the power measurements to profiles of power consumptions of the different flash memory units.

The memory controller may be arranged to perform input/output operations with different flash memory units in a non-overlapping manner.

According to an embodiment of the invention there may be provided a non-transitory computer readable medium that stores instructions that once executed by a memory controller cause the memory controller to perform the steps of measuring a power consumption of a flash memory unit coupled to the memory controller to provide power measurements; wherein the memory controller further may include a read circuit, a write circuit, an erase circuit and a processor.

According to an embodiment of the invention, a method that may include measuring a power consumption of a group of flash memory units to provide power measurements may be provided; and determining a usage of the flash memory units of the group in response to the power measurements.

According to an embodiment of the invention there may be provided a non-transitory computer readable medium that stores instructions that once executed by a memory controller cause the memory controller to perform the steps of measuring a power consumption of a group of flash memory units to provide power measurements; and determining a usage of the flash memory units of the group in response to the power measurements.

According to an embodiment of the invention there may be provided a non-transitory computer readable medium that stores instructions that once executed by a memory controller cause the memory controller to perform the steps of receiving or generating, by a memory controller, power measurements indicative of power consumed by a flash memory unit coupled to the memory controller.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be under

DETAILED DESCRIPTION OF THE DRAWINGS

Figure 1:
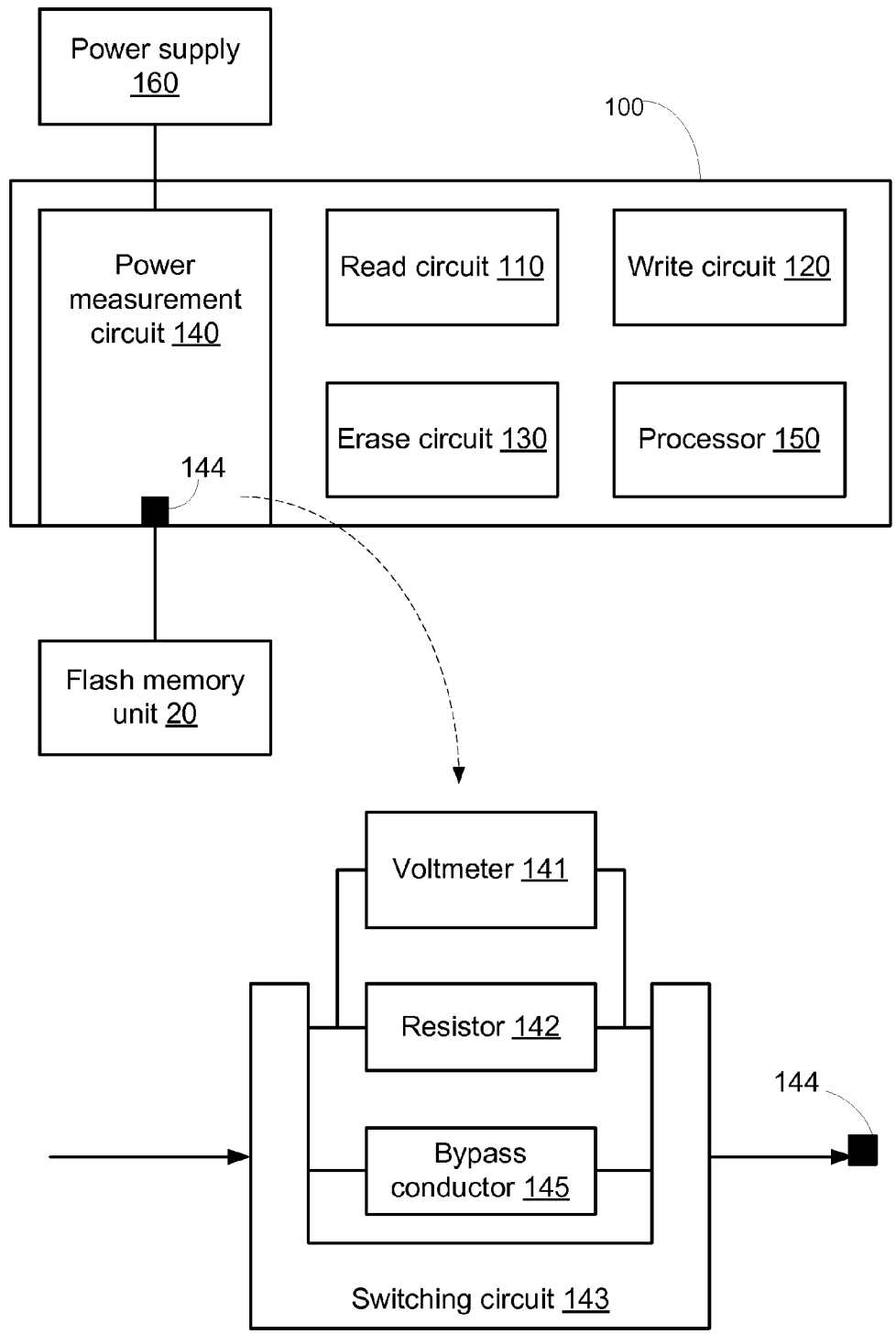
- FIG. 1 illustrates a system that include a memory controller, flash memory unit and power supply according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term "group of flash cells" may include one or more flash memory cells. It may be a page, an erase block, a portion of a page, more than a single page, a portion of an erase block or more that a single erase block.

Erase block is also referred to as a block.

Operational parameters may include any parameter that may affect a manner in which an operation related to a flash memory unit is performed. The operation may be a read operation, a write (program) operation, an erase operation, or a memory management operation.

Measuring the Power Consumed by Flash Memory Unit.

The flash memory unit may be a flash memory chip or multiple flash memory chips. It may be a NAND flash memory unit but this is not necessarily so.

In order to measure the power consumed by the flash memory unit a resistor of a known resistivity may be connected in series between the flash memory unit power supply and the flash memory unit itself. If, for example, the memory controller supplies the power to the flash memory unit via a power output then the resistor may be connected in series to the power output. If there are multiple power outputs for supplying power to one or more flash memory units then one or more resistors can be provided for allowing a measurement of power supplied via the multiple power outputs. One resistor can be allocated for a single power output of more than a single power output. If, the power is supplied not via the memory controller than the memory controller should be coupled to resistors that are serially coupled to the power supply paths or be coupled to voltmeters that measure the voltage developed on the resistors.

It is noted that a resistor that is used for power measurements may be constantly connected to a power path that leads to one or more flash memory units. Alternatively, the resistor may be selectively coupled to the power path using a switching unit. It is further noted that a resistor that is used for power measurements can be dedicated to the power measurements although the power measurements may utilize a resistor that has other roles (for example—it may be an integral part of the power path). It is noted that the resistor may have a complex or only real impedance and that the resistor may be a parasitic resistance.

By measuring the voltage on the resistor it is possible to infer the current running through the resistor and thus also through the flash memory unit as the current I equals a ratio between the voltage V and the resistance R.

Where I is the current in ampere, V is the voltage in volt and R is the known resistivity in Ohm. Such a simple measurement system can be assembled in the laboratory in order to study the power consumption properties of the flash memory unit, but can also be packaged as part of the memory controller to gain many advantages as will be described in the sequel.

FIG. 1 illustrates a system 10 that include a memory controller 100, flash memory unit 20, and power supply 160 according to an embodiment of the invention.

Memory controller 100 may include read circuit 110, write circuit 120, erase circuit 130, power measurement circuit 140 and processor 150. The power measurement circuit 140 is arranged to measure a power consumption of a flash memory unit 20 coupled to the memory controller 100 to provide power measurements.

FIG. 1 illustrates the power measurement circuit 140 as including voltmeter 141, resistor 142, switching circuit 143 and power output 144. Power output 144 is arranged to provide power to flash memory unit 20. Voltmeter 141 is arranged to measure a voltage developed on resistor 142. Switching circuit 143 is arranged to selectively couple resistor 142 to power output 144. The switching circuit 143 may either couple the resistor 142 or a bypass conductor 145.

Figure 2:
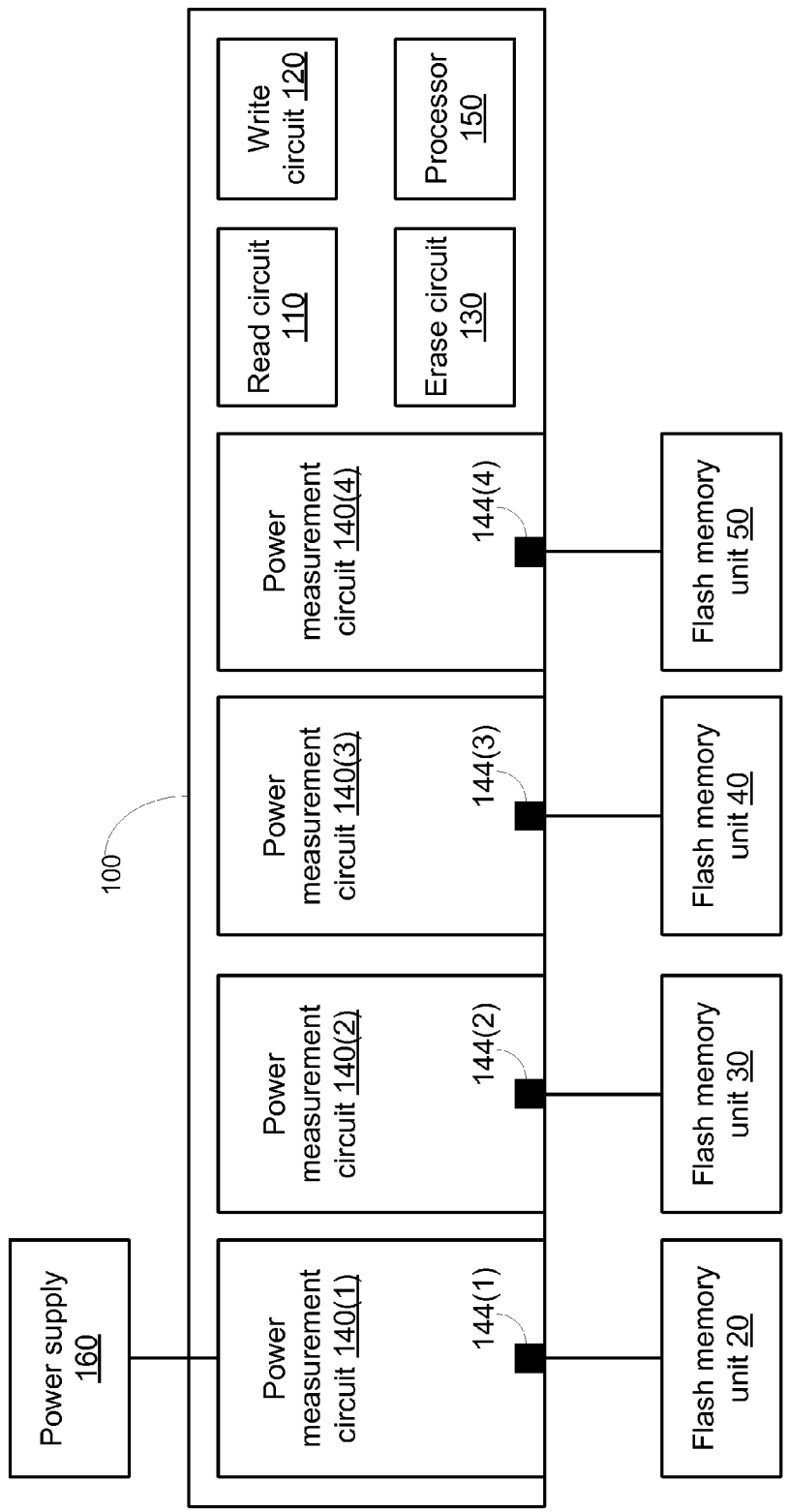
FIG. 2 illustrates a system that include a memory controller, flash memory unit and power supply according to an embodiment of the invention.

FIG. 2 illustrates a system 11 that includes power supply 160, memory controller 100, and four flash memory units 20, 30, 40 and 50 according to an embodiment of the invention. Each flash memory unit may include multiple erase blocks, multiple pages per each erase block and the like. Each flash memory unit may include a buffer as well single level cell (SCL) pages and/or multi level cell (MLC) pages.

Memory controller 100 is coupled to multiple flash memory units such as flash memory units 20, 30, 40 and 50. It has four power outputs 144(1)-144(4)—one per each flash memory unit. The memory controller is illustrated as having four power measurement circuits 140(1)-(4). They may include four resistors, four voltmeters, and four switching circuits.

It is noted that the power measurement circuit 140 may have power measurements circuits than flash memory units. In this case one or more power measurement circuit can perform time division multiplexing.

Alternatively, a single resistor can be used for measuring the aggregate power supplied to more than a single power output.

As indicated above—in case of a memory controller connected to several flash memory units, it is possible to either have a different power measuring circuit for each flash memory unit or share the power measuring circuit for all flash memory units which essentially measures the cumulative power on all device. In the latter case, the power consumption per device may be recovered either by:

a. During times where power measurements are required, flash memory unit commands are sent to each device in a staggered manner such that flash memory unit operations do not overlap between flash memory units. Thus we can make sure that indeed the power measured is indeed specific to a certain device.
  b. Allow flash memory unit commands to be sent to several flash memory units simultaneously and distinguish between power consumed by each flash memory unit by learning, ahead of time, the particular frequency signature of each flash memory unit. As each flash memory unit power consumption can be characterize as a series of pulses, which occur at a certain clock rate, which is different for each flash memory unit. By learning the clock rate of each flash memory unit, we can indeed differentiate between the power consumed by different flash memory units, even if operations overlap.

Adaptive Parameters Optimization

According to an embodiment of the invention there is provided a method that includes adapting operational parameters in view of power measurements.

When taking into account the power measurements an online algorithm executed by the memory controller can produce parameters which provide both fast programming, and low Bit Error Rate (BER) and wear, but also keep the flash memory unit in a regime where it consumes less power during its operations, enabling longer battery life for portable devices which include the flash memory unit.

In order to achieve this goal the power measurements are taken into account by an optimization algorithm. The optimization algorithm calculates a cost function.

The cost to be minimized may be a combination of (a) the power consumed by the flash memory unit while erasing and/or programming and/or reading, and at least one out of (b) measured Bit Error Rate (BER) on all pages, and/or average or max or higher order statistics of the BER values; (c) Busy time when programming all pages, and/or average values of busy time per page type and/or higher order statistics thereof.

Detect Trim Effectiveness, and Range of Active Values

Changing the flash memory unit trims (operational parameters values) may affect the flash memory unit behavior in various manners. These behaviors can be inferred offline and/or online by measuring the power consumed by the flash.

Specific trims may determine the number of erase or program pulses or their amplitude. However, the effect of the trim change may be different outside its range of normal operation, e.g., the number of pulses may have an absolute maximum or minimum. The trim value may also affect a specific behavior, such as the number of program or erase pulses, only through its value masked by some constant, e.g., only the 4 lower bits may determine the number of pulses while the higher bits may be very irrelevant to the flash operation or may affect its behavior otherwise. These kinds of behavior may be inferred by scanning the span of the possible trim values and examining the resulting power consumption profile. Changing the trim value beyond its active range will cause no effect in the power consumption profile. When only the lower bits are active or if there is a different behavior between the upper and lower bits, the power consumption profile will show a periodic behavior when scanned over all possible ranges, etc.

Some trims may have only a limited range of valid values, outside of which the flash memory unit may not behave properly, e.g., it may not be able to erase, program or read successfully, or it may even get stuck and require a reset command or power reset.

There is a need in finding out the valid range per trim; however this range may change during the flash memory unit lifecycle, due to, e.g., temperature changes or flash memory unit aging. The valid range may be found without requiring a full erase, program, read and counting the number of errors, by only erasing and verifying the power consumption profile is similar to that occurring during normal flash operation. Only if the power consumption during the erase operation is valid, programming should be performed and again the power consumption profile should be verified.

In addition, temperature changes may influence the power consumption profile, and thus by measuring the power consumption and comparing the resulting profile to previously recorded profiles at different temperatures, the current temperature at which the flash memory unit operates can be estimated.

Several trims may control the speed with which the flash is erased or programmed, thus allowing, "over clocking" of the flash memory operations. Examining the power consumption profile allows us to infer whether the flash memory unit can operate at a specific over-clocking factor, the limit may be different for different flash memory units, cycle counts and temperatures, without having to perform a full block erase, program and read cycle.

Exploit Correlation Between Power Consumption and Wear

Some flash memory units may exhibit a typical behavior according to which applying more and/or stronger erase and/or program pulses may cause accelerated wear, i.e., the BER may rise faster as the number of P/E cycles increases. The number of pulses and their strength is clearly detectable from the power consumption profile, which can be measured according to our proposal. Thus—a block of flash memory cells will be regarded as having a higher wear level than another block of flash memory cells if it is erased using more programming pulses and/or stronger programming pulses.

Other factors may not be directly linked to the number or amplitude of the pulses but can otherwise be detectable in the power consumption profile, e.g., power consumption between commands or between pulses.

There is provided a method that may find the correlation between the power consumption profile of the flash memory unit and the wear. Once that relation is known, an online algorithm should modify the flash trims in a manner, which will make the power consumption profile strive to resemble a profile, which is known to cause low wear.

The advantage of this method is rooted in the way in which wear has to be measured. Wear is a phenomenon, which describes the deterioration of the flash memory over a relatively large number of P/E cycles. This behavior can be studied offline in the laboratory while designing the product but is very difficult to implement in an online fashion, since the effect of a change can only be measured after a large number of cycles, which also take a long time.

The relationship between wear and power consumption can be studied offline, and the online algorithm may use the received power consumption profile which is available after every cycle. It is noted that the relationship can be augmented in view of online measurements.

According to an embodiment of the invention the wear estimation may start by performing T power measurements.

For set of N possible trims combinations:
  a. Measure the power consumption profile (possibly per cycle)—resulting in a [N×C×T] matrix. N being the number of profiles, C being the number of cycles. T being the number of power measurements per power profile. The matrix is denoted P.
  b. Measure the wear (defined here as the BER) after a performing a certain number (X) of program erase (P/E) cycles using a constant set of trims, e.g., the flash memory unit default trims, resulting in a vector of N wear values denoted as W.

Online Phase:

The expected wear of a set of trims according to the power consumption profile they induce is calculated:
  a. Measure the current power consumption profile p.
  b. Set w=0;
  c. Set c as the current number of cycles;
  d. For each n of the possible N trims sets;
  e. Calculate the correlation between p and the profile saved in P for the current cycle; w=w+W(n)*corr(p, P(n,c))

Algorithm decision (two possible algorithms):
  a. The expected wear w may be incorporated in a general online adaptive algorithm, which takes other factors in account as well and appropriately weigh the expected wear relatively to memory performance, number of errors, power consumption etc.
  b. If the reducing wear is the main goal and other factors are of less importance, choose the set of trims for which for this number of cycles, P(n,c) is minimal.

System Power Management

Devices which use flash memory may have several flash memory units, each able to store and retain data. Each unit has its own power consumption values, which may also vary with the amount of P/E cycles performed.

Power consumption may play an important role when performing many kinds of system level decisions, including the ones described below.

Memory controller management operations, such as cleaning, merging and others perform operations directly on the flash memory and thus may interfere with the speed with which the user is able to program or read from the flash memory, since it is busy performing management initiated operations. For this reason, system management operations are best performed at idle times.

There are provided various considerations and strategies, which take into account system level decisions and flash memory power consumption.

Standard wear leveling dictates that all the available memory blocks (on all memory units if several are available) should strive to have a similar number of P/E cycles to maintain smooth performance over time. However, under strict power consumption constraints, e.g., a mobile device unplugged and/or with little remaining battery time, it is suggested to alleviate the wear leveling constraints and use the flash memory blocks which consume less power more frequently.

Similarly, to allow for overall wear leveling, the flash memory blocks, which consume more power, should be advanced faster during periods when the flash memory unit is plugged in.

Extremely strict power consumption regimes may even dictate a full shutdown of some of the strongest power consuming flash memory blocks.

Note that in this case waking them up will cost additional time and power when needed. For this reason, data that is read frequently should be stored in the less power consuming memory blocks.

In a more general formalization, we have a score s defining the relative requirements from the next cycle scaling between 0 for maximum performance and 1 for minimum power consumption. All the flash memory blocks in the system are given a score:

$$S = \frac{1}{2}\left(1 - \frac{p - p_{min}}{p_{max} - p_{min}} + \frac{c - c_{min}}{c_{max} - c_{min}}\right),$$

Where p is the performance measured in the last cycle on this block, c is the latest total power consumption, and p_min, p_max, c_min, c_max are the respective minimum and maximum performance and power consumption values for all the memory blocks in the system.

When required to perform a cycle with requirement score equal to s, we choose the block with the closest value S.

$$\operatorname*{argmin}_{i=0}^{N-1} |S_i - s|$$

Memory management operations may not be performed during times when the power consumption constraints are strict, e.g., mobile device unplugged and/or battery power running low.

During these periods it is preferable to lose on some system merits such as write amplification in order to avoid power consuming memory operations, which were not specifically required by the user.

In detail, all required writes should be first directed to the controller buffers, which do not require any flash memory unit operations. When the buffers are full they should be written to free SLC blocks, trying to avoid the additional folding to TLC pages.

Only if the system runs out of SLC blocks, which is not likely, since it is not likely the device will be required to perform many write operations under tight power consumption constraints, should the SLC blocks be folded into TLC blocks and freed up to receive the next write commands. Adversely, when the device is plugged into a power outlet, the memory buffers should be freed by writing them to SLC blocks and SLC blocks should be freed by folding their content into TLC blocks, so they can be free for the next period of operation without an external power source.

Extreme power consumption constraint mode—unlike standard power consumption constraint mode (unplugged from a power outlet), there are extreme cases when the battery is running extremely low and the device might unexpectedly shut down at any moment. In this mode we should not trust the memory buffers, which cannot retain data during system shut down. In this mode the writes will be performed directly to SLC blocks, and all data already written to buffers should also be quickly moved to SLC blocks.

Another advantage for managing power consumption at the system level is to curb the short time max power consumption.

On a flash memory unit, a good portion of the power is consumed in pulses. For example, during programming or erase operations, the memory controller applied different programming or erase pulses. At the initiation of each such pulse, power is consumed causing large max to average power differences. In case of a system containing several flash memory units, these power spike may coincide, causing much larger over power spikes. The timing of these power spikes may depend on the internal device clock and the synchronization between the dies. By measuring power, it is possible to learn the internal clock on each die and time the flash memory unit commands to each die in a manner that makes sure that the power spikes are not synchronized and thus limit the max power requirements.

Figure 3:
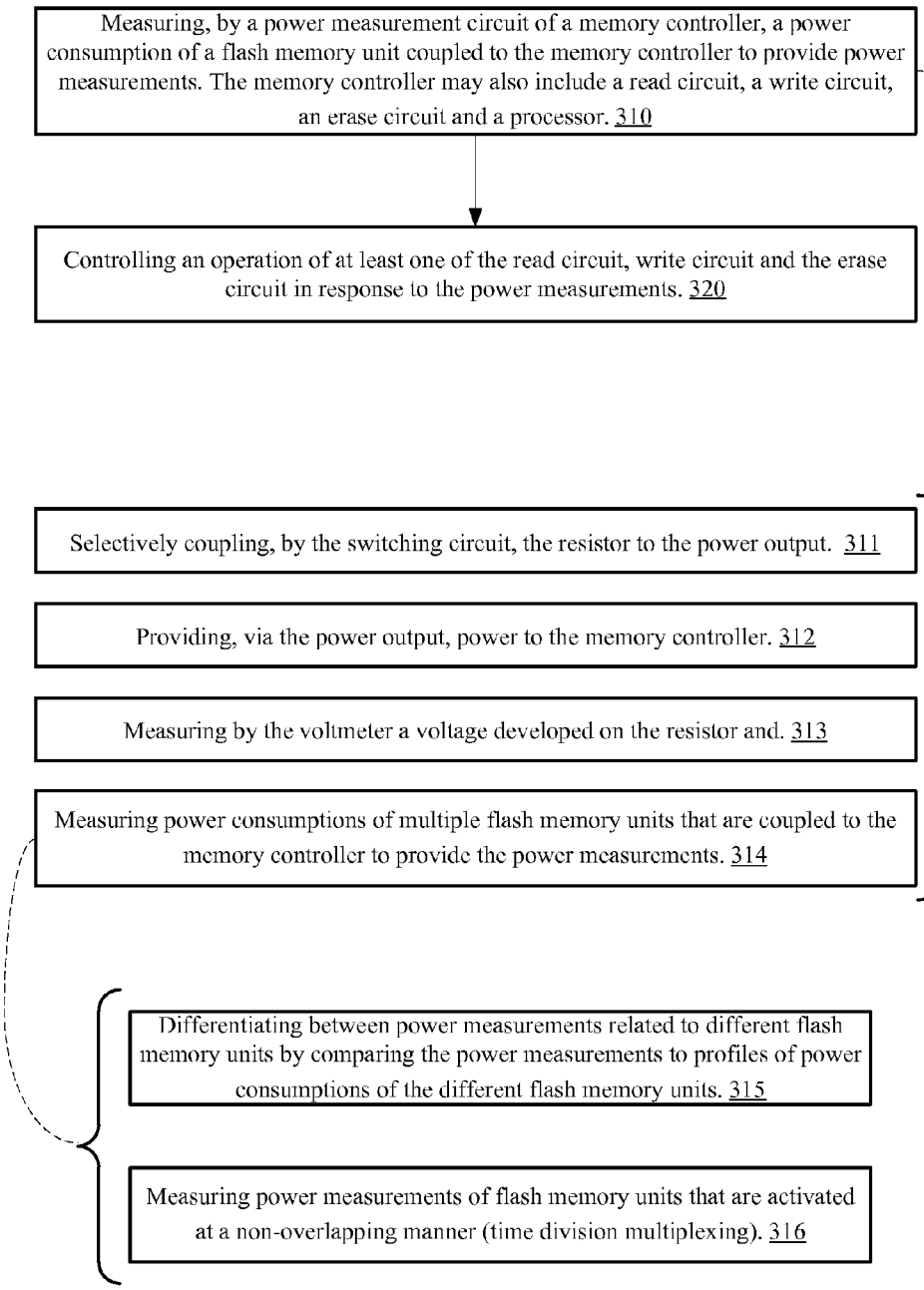
FIG. 3 illustrates a method according to an embodiment of the invention.

FIG. 3 illustrates method 300 according to an embodiment of the invention.

Method 300 may start by stage 310 of measuring, by a power measurement circuit of a memory controller, a power consumption of a flash memory unit coupled to the memory controller to provide power measurements. The memory controller may also include a read circuit, a write circuit, an erase circuit, and a processor.

The power measurement circuit may include a voltmeter, a resistor, a switching circuit, and a power output. Stage 310 may include stage 311 of selectively coupling, by the switching circuit, the resistor to the power output, stage 312 of providing, via the power output, power to the memory controller and stage 313 of measuring by the voltmeter a voltage developed on the resistor.

Although stage 310 referred to measuring a power consumption of a single flash memory unit. It is noted that stage 310 may be applied form multiple flash memory units.

The power measurements can provide information about power consumption at different points of time. For example—it may indicate when power pulses occurred and what was the intensity of these pulses.

Accordingly, stage 310 may include stage 314 of measuring power consumptions of multiple flash memory units that are coupled to the memory controller to provide the power measurements.

Stage 314 may include stage 315 of differentiating between power measurements related to different flash memory units by comparing the power measurements to profiles of power consumptions of the different flash memory units.

Stage 314 may include stage 316 of measuring power measurements of flash memory units that are activated at a non-overlapping manner (time division multiplexing). Thus, the memory controller may perform input/output operations with different flash memory units in a non-overlapping manner and perform power measurements during these non-overlapping IO operations.

Stage 310 may be followed by stage 320 of controlling an operation of at least one of the read circuit, write circuit and the erase circuit in response to the power measurements.

Figure 4:
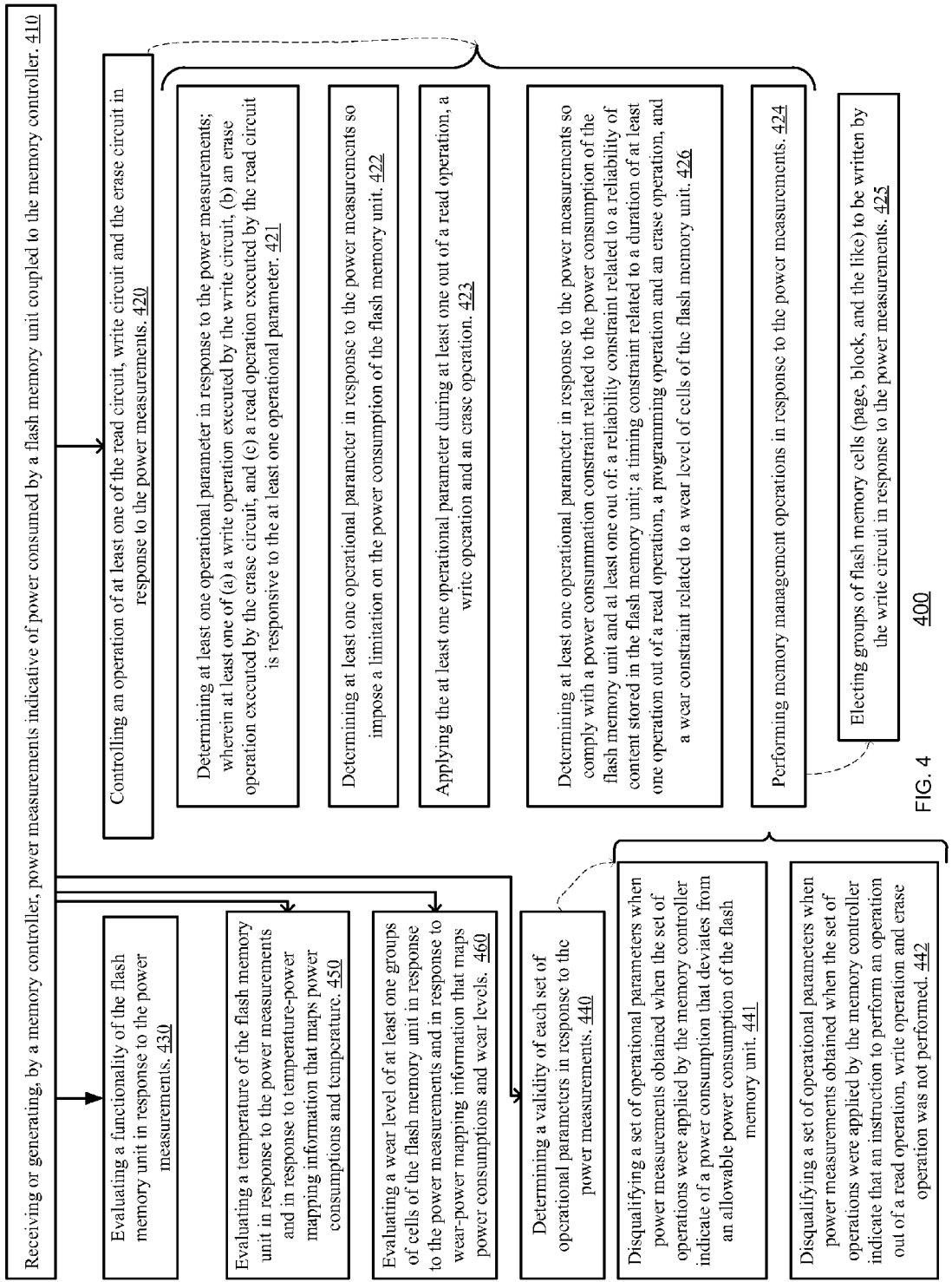
FIG. 4 illustrates a method according to an embodiment of the invention.

FIG. 4 illustrates method 400 according to an embodiment of the invention.

Method 400 may start by stage 410 of receiving or generating, by a memory controller, power measurements indicative of power consumed by a flash memory unit coupled to the memory controller.

In case of generating the power measurements then stage 410 may include stage 310 of method 300. In case of receiving the power measurements then the power measurements can be generated a unit other than the memory controller. This unit may be a power measurement circuit that is not included in the memory controller. For example— the power measurements may be performed by a power management circuit that is arranged to control the power consumption of a system that includes the memory controller and the flash memory unit.

It is noted that stage 410 may include receiving or generating power measurements indicative of power consumed by multiple flash memory unit coupled to the memory controller. For simplicity of explanation the following will refer to a single flash memory unit.

Stage 410 may be followed by stage 420 of controlling an operation of at least one of the read circuit, write circuit and the erase circuit in response to the power measurements.

Examples of stage 420 are illustrated in the section titled "Adaptive parameters optimization."

Stage 420 may include at least one of the following stages:

a. Determining (421) at least one operational parameter in response to the power measurements; wherein at least one of (a) a write operation executed by the write circuit, (b) an erase operation executed by the erase circuit, and (c) a read operation executed by the read circuit is responsive to the at least one operational parameter. Non-limiting examples of operational parameter include an initial voltage value in a programming/erase operation, a step size in a programming/erase operation, a stop value in a programming/erase operation, a number of programming pulses.

b. Determining (422) at least one operational parameter in response to the power measurements so impose a limitation on the power consumption of the flash memory unit. The limitation may be a maximal allowable power consumption, a required minimal power consumption (minimizing the power consumption).

c. Applying (423) the at least one operational parameter (Set during stage 421 or 422) during at least one out of a read operation, a write operation and an erase operation.

d. Performing (424) memory management operations in response to the power measurements.

e. Stage 424 may include electing (425) groups of flash memory cells (page, block, and the like) to be written by the write circuit in response to the power measurements. For example—more write operations may be aimed to groups of flash memory cells of lower power consumption.

f. Determining (426) at least one operational parameter in response to the power measurements so comply with a power consummation constraint related to the power consumption of the flash memory unit and at least one out of a reliability constraint related to a reliability of content stored in the flash memory unit; a timing constraint related to a duration of at least one operation out of a read operation, a programming operation and an erase operation, and a wear constraint related to a wear level of cells of the flash memory unit.

Stage 410 may be followed by stage 430 of evaluating a functionality of the flash memory unit in response to the power measurements.

The power measurements received or generated during stage 410 may be obtained during multiple time periods during which the flash memory unit was configured according to multiple sets of operational parameters. In this case stage 410 may be followed by stage 440 of determining a validity of each set of operational parameters in response to the power measurements.

Examples of stages 430 and 440 are provided in the section titled "Detect trim effectiveness, and range of active values."

Stage 440 may include:
a. Disqualifying (441) a set of operational parameters when power measurements obtained when the set of operations were applied by the memory controller indicate of a power consumption that deviates from an allowable power consumption of the flash memory unit.
b. Disqualifying (442) a set of operational parameters when power measurements obtained when the set of operations were applied by the memory controller indicate that an instruction to perform an operation out of a read operation, write operation and erase operation was not performed.

Stage 410 may be followed by stage 450 of evaluating a temperature of the flash memory unit in response to the power measurements and in response to temperature-power mapping information that maps power consumptions and temperature.

Stage 410 may be followed by stage 460 of evaluating a wear level of at least one groups of cells of the flash memory unit in response to the power measurements and in response to wear-power mapping information that maps power consumptions and wear levels. The power measurements can provide a power consumption profile of the flash memory unit. The power consumption profile can be compared to power consumption profiled represented in the wear-power mapping information to find a matching power consumption profile. The wear level of the matching power consumption profile is assumed to be the wear level of the group of flash cells that were programmed, erased, or read while the power measurements were taken.

Non-limiting examples of stage 460 can be found in the section titled "Exploit correlation between power consumption and wear."

It is noted that method 400 may include generating the wear-power mapping information. This may include performing power measurements related to a group of flash memory cells of which the wear level is known of measured in manner that differ from an analysis of the power measurements. For example—the wear level can be estimated in response to the duration of programming, to the reliability of data stored in the group of the flash memory cells, to a combination of P/E cycle and timing information indicative of retention periods, and the like.

According to an embodiment of the invention the controlling (420) of the operation of at least one of the read circuit, write circuit and the erase circuit can be responsive to the power measurements and to the outcome of one or more stage out of stages 430, 440, 450 and 460. For example, the controlling may be responsive to at least one out of the wear level of one or more groups of flash memory cells, to the temperature of the flash memory unit, to a functionality of the flash memory unit, to a validity of one or more sets of operational parameters. For example—if a set of operational parameters is disqualified then the flash memory unit may be operated using other (non-disqualified) sets of operational parameters.

Figure 5:
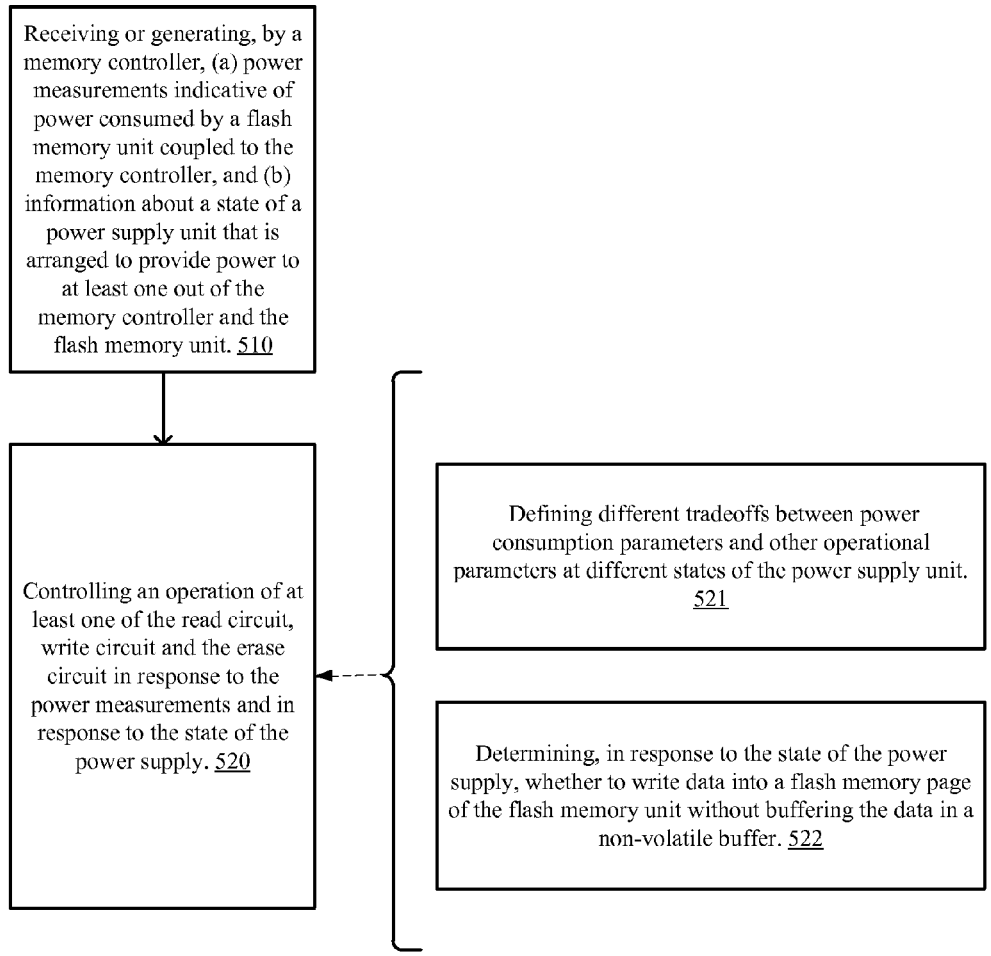
FIG. 5 illustrates a method according to an embodiment of the invention.

FIG. 5 illustrates method 500 according to an embodiment of the invention.

Method 500 may start by stage 510 of receiving or generating, by a memory controller, (a) power measurements indicative of power consumed by a flash memory unit coupled to the memory controller, and (b) information about a state of a power supply unit that is arranged to provide power to at least one out of the memory controller and the flash memory unit. The state of the power supply unit may be the fullness of the power supply.

It is noted that stage 510 may include receiving or generating power measurements indicative of power consumed by multiple flash memory unit coupled to the memory controller. For simplicity of explanation the following will refer to a single flash memory unit.

Stage 510 may be followed by stage 520 of controlling an operation of at least one of the read circuit, write circuit and the erase circuit in response to the power measurements and in response to the state of the power supply.

Non-limiting examples of stage 520 are illustrated in the section titled "System power management."

Stage 520 may include defining (521) different tradeoffs between power consumption parameters and other operational parameters at different states of the power supply unit.

The operational parameters may include at least one out of a reliability of content stored in the flash memory unit, a duration of at least one operation out of a read operation, a programming operation and an erase operation and wear resulting from the at least one operation.

Stage 520 may include determining (522), in response to the state of the power supply, whether to write data into a flash memory page of the flash memory unit without buffering the data in a non-volatile buffer.

Binning of Produced Flash Memory Units According to their Power Consumption.

In the normal process of producing large batches of flash memory units, the produced units vary in many aspects, e.g., different bad blocks, different speeds, different number of errors per block etc. The manufacturer then adjusts the trims for each unit to achieve a smaller variance in overall behavior, but still some variance remains.

There is provided a method in which the flash memory units may be binned according to their power consumption. The heavier power consumers may be directed to less power constrained applications, e.g., SSD for storage servers, while the least power consuming units should be used in products where power consumption is critical, e.g., hand-held mobile devices. To this end the power consumption profile should be measured after the manufacturing process is complete and the units should be binned according to the integral over the power consumption profile when performing a standard set of operations idle time, erase, program and read.

Assuming the above binning is performed, it is not as crucial to keep the power consumption variance low. Units, which were randomly produced with lower power consumption, may be beneficial for power constrained products and thus their trims should not be tempered to be made similar to the batch average. In fact, they may even be altered to make these units consume even less power.

Since the power consumption may change with the number of P/E cycles, the binning process above should cycle the devices to different cycle values up to the maximal demanded by their specs and bin the devices using the power consumption characteristics in all cycles. For example, some products are expected to reach a lower number of P/E cycles during their life and thus should get the units with the respective power consumption up to this cycle. Other products may have strict power consumption constraints at start of life, and more relaxed in the end of life.

Figure 6:
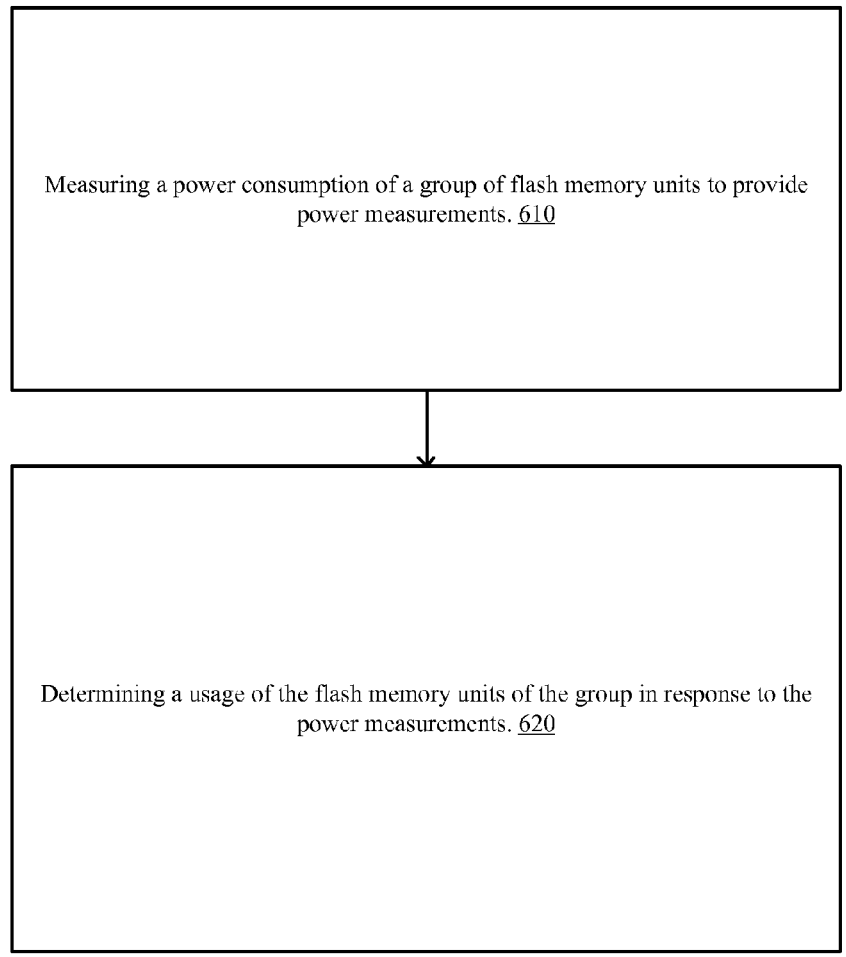
FIG. 6 illustrates a method according to an embodiment of the invention.

FIG. 6 illustrates method 600 according to an embodiment of the invention.

Method 600 may start by stage 610 of measuring a power consumption of a group of flash memory units to provide power measurements.

Stage 610 may be followed by stage 620 of determining a usage of the flash memory units of the group in response to the power measurements.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library, and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units, or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Moreover, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for power measurements of a flash memory unit, the method comprises measuring, by a power measurement circuit of a memory controller, a power consumption of a flash memory unit coupled to the memory controller to provide power measurements;
    wherein the memory controller further comprises a read circuit, a write circuit, an erase circuit and a processor;
    wherein the power measurement circuit comprises a voltmeter, a resistor, a switching circuit and a power output;
    wherein method further comprises:
    providing, via the power output, power to the memory controller;
    measuring by the voltmeter a voltage developed on the resistor; and
    selectively coupling, by the switching circuit, the resistor to the power output.

2. A method for controlling a flash memory unit, the method comprises:
    receiving or generating, by a memory controller, power measurements indicative of power consumed by a flash memory unit coupled to the memory controller;
    wherein at least one of the following is true:
    (i) the method comprises applying multiple sets of operational parameters during an obtaining of the power measurement results; and determining a validity of each set of operational parameters in response to the power measurements; and
    (ii) the method comprises evaluating a wear level of at least one group of cells of the flash memory unit in response to the power measurements and in response to wear-power mapping information that maps power consumptions and wear levels.

3. The method according to claim 2 comprising controlling an operation of at least one of the read circuit, the write circuit and the erase circuit in response to the power measurements.

4. The method according to claim 2 comprising determining the at least one operational parameter in response to the power measurements; wherein the at least one of (a) a write operation executed by the write circuit, (b) an erase operation executed by the erase circuit, and (c) a read operation executed by the read circuit is responsive to the at least one operational parameter.

5. The method according to claim 2 comprising determining at least one operational parameter in response to the power measurements to impose a limitation on the power consumption of the flash memory unit.

6. The method according to claim 2 comprising determining at least one operational parameter in response to the power measurements to comply with a power consummation constraint related to the power consumption of the flash memory unit and at least one out of: a reliability constraint related to a reliability of content stored in the flash memory unit; a timing constraint related to a duration of at least one operation out of a read operation, a programming operation and an erase operation, and a wear constraint related to a wear level of cells of the flash memory unit.

7. The method according to claim 2 comprising evaluating a functionality of the flash memory unit in response to the power measurements.

8. The method according to claim 2 comprising applying the multiple sets of operational parameters during the obtaining of the power measurement results; and determining the validity of each set of operational parameters in response to the power measurements.

9. The method according to claim 8 comprising disqualifying a set of operational parameters when power measurements obtained when the set of operations were applied by the memory controller indicate of a power consumption that deviates from an allowable power consumption of the flash memory unit.

10. The method according to claim 8 comprising disqualifying a set of operational parameters when power measurements obtained when the set of operations were applied by the memory controller indicate that an instruction to perform an operation out of a read operation, write operation and erase operation was not performed.

11. The method according to claim 2 comprising evaluating a temperature of the flash memory unit in response to the power measurements and in response to temperature-power mapping information that maps power consumptions and temperature.

12. The method according to claim 2 comprising evaluating the wear level of the at least one group of cells of the flash memory unit in response to the power measurements and in response to the wear-power mapping information that maps power consumptions and wear levels.

13. The method according to claim 12 comprising generating the wear-power mapping information.

14. The method according to claim 2 comprising performing memory management operations in response to the power measurements.

15. The method according to claim 2 comprising electing groups of flash memory cells to be written by the write circuit in response to the power measurements.

16. The method according to claim 2 comprising controlling an operation of at least one of the read circuit, the write circuit and the erase circuit in response to the power measurements and in response to a state of a power supply unit that is arranged to provide power to at least one out of the memory controller and the flash memory unit.

17. The method according to claim 16 comprising defining different tradeoffs between power consumption parameters and other operational parameters at different states of the power supply unit.

18. The method according to claim 17 wherein other operational parameters are selected of a group consisting of (i) a reliability of content stored in the flash memory unit, (ii) a duration of at least one operation out of a read operation, a programming operation and an erase operation, and (iii) a wear resulting from the at least one operation.

19. The method according to claim 16 comprising determining, in response to the state of the power supply, whether to write data into a flash memory page of the flash memory unit without buffering the data in a non-volatile buffer.

20. The method according to claim 2 comprising measuring power consumptions of multiple flash memory units that are coupled to the memory controller to provide the power measurements; wherein the multiple flash memory units comprise the flash memory unit.

21. The method according to claim 20 comprising differentiating between power measurements related to different flash memory units by comparing the power measurements to profiles of power consumptions of the different flash memory units.

22. The method according to claim 20 comprising performing input/output operations with different flash memory units in a non-overlapping manner.

23. A memory controller, the memory controller comprises a read circuit, a write circuit, an erase circuit, a power measurement circuit and a processor; wherein the power measurement circuit is arranged to measure a power consumption of a flash memory unit coupled to the memory controller to provide power measurements; and wherein at least one of the following is true:
   (i) the memory controller is configured to apply multiple sets of operational parameters during an obtaining of the power measurement results; and determine a validity of each set of operational parameters in response to the power measurements; and
   (ii) the power measurement circuit comprises a voltmeter, a resistor, a switching circuit and a power output, wherein memory controller is configured to provide, via the power output, power; wherein the voltmeter is configured to measure a voltage developed on the resistor; and wherein the switching circuit is configured to selectively couple the resistor to the power output.

24. A non-transitory computer readable medium that stores instructions that once executed by a memory controller cause the memory controller to perform the steps of measuring a power consumption of a flash memory unit coupled to the memory controller to provide power measurements; wherein the memory controller further comprises a read circuit, a write circuit, an erase circuit and a processor; wherein at least one of the following is true:
   (i) the non-transitory computer readable medium stores instructions that once executed by the memory controller cause the memory controller to apply multiple sets of operational parameters during an obtaining of the power measurement results; and determine a validity of each set of operational parameters in response to the power measurements; and
   (ii) the non-transitory computer readable medium stores instructions that once executed by the memory controller cause the memory controller to evaluate a wear level of at least one groups of cells of the flash memory unit in response to the power measurements and in response to wear-power mapping information that maps power consumptions and wear levels.

25. A memory controller that comprises a read circuit, a write circuit, an erase circuit, a power measurement circuit and a processor; wherein the power measurement circuit is arranged to measure a power consumption of a flash memory unit coupled to the memory controller to provide power measurements; wherein the power measurement circuit comprises a voltmeter, a resistor, a switching circuit and a power output, wherein power output is to provide power to the memory controller, wherein the voltmeter is arranged to measure a voltage developed on the resistor; wherein the switching circuit is arranged to selectively couple the resistor to the power output.

* * * * *